(12) United States Patent
Licht et al.

(10) Patent No.: US 7,742,843 B2
(45) Date of Patent: Jun. 22, 2010

(54) METHOD FOR THE STRUCTURED APPLICATION OF A LAMINATABLE FILM TO A SUBSTRATE FOR A SEMICONDUCTOR MODULE

(75) Inventors: Thomas Licht, Warstein (DE); Alfred Kemper, Warstein (DE)

(73) Assignee: Infineon Technologies AG, Munich (DE)

( * ) Notice: Subject to any disclaimer, the term of this patent is extended or adjusted under 35 U.S.C. 154(b) by 259 days.

(21) Appl. No.: 11/548,873

(22) Filed: Oct. 12, 2006

(65) Prior Publication Data

US 2007/0111475 A1    May 17, 2007

Related U.S. Application Data

(63) Continuation of application No. PCT/EP2005/003325, filed on Mar. 30, 2005.

(30) Foreign Application Priority Data

Apr. 16, 2004  (DE)  ........................ 10 2004 018 468

(51) Int. Cl.
    G05D 23/00     (2006.01)
    H01L 23/495    (2006.01)
    H01L 23/00     (2006.01)
    H01L 23/12     (2006.01)
    H01L 23/053    (2006.01)

(52) U.S. Cl. ................. 700/299; 257/666; 257/667; 257/668; 257/700; 257/703; 216/65; 216/83

(58) Field of Classification Search ................ None
See application file for complete search history.

(56) References Cited

U.S. PATENT DOCUMENTS

| | | | | |
|---|---|---|---|---|
| 4,178,396 A | * | 12/1979 | Okano et al. ................. 438/593 |
| 4,334,349 A | * | 6/1982 | Aoyama et al. ............. 438/670 |
| 4,714,516 A | * | 12/1987 | Eichelberger et al. ......... 216/62 |
| 4,764,485 A | * | 8/1988 | Loughran et al. ........... 438/690 |
| 4,783,695 A | * | 11/1988 | Eichelberger et al. ....... 257/668 |
| 5,313,367 A | * | 5/1994 | Ishiyama ..................... 361/772 |
| 5,525,537 A | * | 6/1996 | Zachai et al. ................ 438/105 |
| 5,746,868 A | * | 5/1998 | Abe ............................ 156/247 |

(Continued)

FOREIGN PATENT DOCUMENTS

DE    19617055 C1    6/1997

(Continued)

OTHER PUBLICATIONS

International Search Report and Written Opinion for International Patent Application No. PCT/EP2005/003325, filed Mar. 30, 2005 (13 pages), Mailing Date Nov. 24, 2005.

*Primary Examiner*—Ramesh B Patel
*Assistant Examiner*—Sunray R Chang
(74) *Attorney, Agent, or Firm*—Coats & Bennett, P.L.L.C.

(57) ABSTRACT

A method for structured application of a laminatable intermediate layer (9) to a substrate (1) for a semiconductor module, wherein a separating layer is indirectly or directly applied to the substrate (1) over a large surface, the intermediate layer (9) is applied to the substrate (1), including the separating layer(s), by lamination, over a large surface, the intermediate layer (9) is opened in places on the substrate (1), where recesses are provided for the intermediate layer (9), and the separating layer (8) is removed in these places.

22 Claims, 4 Drawing Sheets

U.S. PATENT DOCUMENTS

| | | | |
|---|---|---|---|
| 5,856,913 A * | 1/1999 | Heilbronner | 361/760 |
| 6,225,028 B1 | 5/2001 | Bhatt et al. | 430/311 |
| 6,294,741 B1 | 9/2001 | Cole, Jr. et al. | 174/260 |
| 6,881,071 B2 * | 4/2005 | Heilbronner | 439/67 |
| 2005/0032347 A1 | 2/2005 | Hase et al. | 438/612 |

FOREIGN PATENT DOCUMENTS

| | | |
|---|---|---|
| EP | 0461316 A1 | 12/1991 |
| EP | 0573134 A1 | 1/1993 |
| WO | 03/030247 A2 | 4/2003 |

* cited by examiner

METHOD FOR THE STRUCTURED APPLICATION OF A LAMINATABLE FILM TO A SUBSTRATE FOR A SEMICONDUCTOR MODULE

CROSS-REFERENCE TO RELATED APPLICATIONS

This application is a continuation of copending International Application No. PCT/EP2005/003325 filed Mar. 30, 2005 which designates the United States, and claims priority to German application number 10 2004 018 468.2 filed Apr. 16, 2004, the contents of which are hereby incorporated by reference in its entirety.

TECHNICAL FIELD

The invention relates to a method for the structured application of a laminatable film to a substrate for a semiconductor module.

BACKGROUND

In many power applications, semiconductors are used in the form of so-called power semiconductor modules which contain one or more semiconductor components or, if appropriate, additional components. Depending on the purpose of application, the individual modules have different packaging. However, irrespective of the type of packaging, it is necessary in every case to connect the semiconductor components and, if appropriate, further components to one another electrically. Furthermore, the components are intended for connection to external connecting elements. The technology for connecting between the individual components represents a significant problem here.

Frequently applied connecting technology in this context is so-called wire bonding. In this context, wires made of aluminum are attached to a contact face made of aluminum or copper by means of ultrasonic energy, an intermetallic connection being produced. In addition, by way of example, ThinPak, MPIPPS or flip-chip technologies are also used to a greater or lesser extent. All these connection techniques have their specific advantages and disadvantages, with the disadvantages predominating in most application cases.

Disadvantages of the most frequently used connection technology, wire bonding, are, for example, the very slow, very costly and thus cost-intensive process per se as well as the high susceptibility to faults both during manufacture and during operation of the module itself. What is certainly the greatest disadvantage of wire bonding is here the fact that in particular semiconductor components are subjected to large mechanical stresses during the bonding process, and these lead to a high rejection rate. Furthermore, wire bonds can also easily break during the subsequent manufacturing steps or during operation of the semiconductor module, which in turn increases the rejection rate and reduces the reliability of the semiconductor module.

In order to avoid these disadvantages, so-called wire bondless modules, which are frequently based on the application of lamination techniques, have frequently been used in recent times. An example of such a module and its manufacturing method are described, for example, in DE 196 17 055 C1.

Such a power semiconductor module comprises at least one electrically insulating substrate on which surfaces made of an electrically conductive material are patterned. Semiconductor components are electrically connected to these surfaces, the surfaces and/or semiconductor components being additionally connected to connecting elements which lead to the outside. The semiconductor components are electrically connected to the patterned surfaces here on one side by soldering or by means of pressure contact and are in contact on the other side with a flexible printed circuit board by soldering or by means of pressure contact. The arrangement is insulated by means of lamination using patterned insulation intermediate layers, cutouts being provided for the semiconductor components in order to make contact. These cutouts can already be provided in advance, in which case very good fitting accuracy has to be achieved. Another method is to laminate an insulating intermediate layer without cutouts and to remove the insulation at the locations provided for that purpose, for example by means of mechanical processing or preferably by means of lasers. Although significantly higher precision is achieved here there is then the risk either of parts remaining on the underlying surface, which make the formation of contacts more difficult or even prevent it entirely, or else of material which lies under the intermediate layer, that is to say a contacting face or a component, being damaged. Consequently, precise erosion is relatively time consuming.

SUMMARY

The object of the invention is therefore to specify a method of the type mentioned at the beginning in which both precise and rapid erosion can take place at the locations provided for that purpose.

According to an embodiment, a method for the structured application of a laminatable intermediate layer to a substrate for a semiconductor module, comprises the steps of: applying a separating layer indirectly or directly to the substrate over a large area, applying the intermediate layer by lamination over a large area to the substrate including the isolating layer or layers, opening the intermediate layer at locations on the substrate at which cutouts are provided in the intermediate layer, and removing the isolating layer at these locations.

BRIEF DESCRIPTION OF THE DRAWINGS

The invention will be explained in more detail below with reference to the exemplary embodiments illustrated in the figures of the drawing, in which.

DETAILED DESCRIPTION

An essential feature according to the embodiments is that an isolating layer is applied to the substrate directly or indirectly, i.e. for example by means of components which are attached to the substrate. The isolating layer itself may be continuous or patterned here. In the case of a continuous isolating layer, an intermediate layer is applied to the isolating layer, and in the case of a patterned isolating layer to the corresponding parts of the isolating layer and the parts of the substrate which are not covered by the isolating layer, over a large area by means of lamination. At locations at which cutouts are provided in the intermediate layer, the intermediate layer is then opened and the isolating layer, or at least residues thereof, are removed from it at these locations.

According to an embodiment, when the intermediate layer is opened or eroded by means of a laser, but also with all the other erosion methods, the invention prevents, on the one hand, the entire material of the intermediate layer being eroded so that there are no residues at all, but at the same time damage to the underlying layer is avoided since the isolating layer acts, as it were, as a buffer. According to different embodiments, "more gentle" methods can then be used to carry out erosion around the remaining parts of the isolating layer, which does not, for example, have the stability or durability of the intermediate layer.

According to an embodiment, the isolating layer may contain silicone, have organic compounds or be photo-sensitive (as is, for example, photoresist). In particular, according to an embodiment, if it is desired to pattern the isolating layer, the said layer can be sprayed on by means of selective dispensing or structured dispensing, printed on (inkjet printing, screen printing) or be generated using a lithographic method. In this way it is possible to apply the isolating layer without a large degree of expense in terms of equipment and with a high level of processing reliability, in particular in conjunction with a desired structure. According to an embodiment, in order to produce a patterned isolating layer it is however also possible to apply a photo-sensitive isolating layer over a large area and then expose it in accordance with the desired pattern. According to an embodiment, depending on the use of a photo-positive or photo-negative layer it is possible to remove exposed or unexposed parts of the isolating layer, for example by developing and/or etching. Corresponding developments and etching methods can however also be applied in order to remove the isolating layer after the intermediate layer has been opened.

According to an embodiment, the opening of the intermediate layer at the locations provided for that purpose will preferably be carried out by laser ablation, that is to say burning away the intermediate layer by means of laser. However, according to an embodiment, it is alternatively possible also to provide the intermediate layer by mechanical abrasion (for example grinding, milling, drilling) or, if appropriate, by chemical abrasion (for example etching) in conjunction with an additional cover layer. However, according to an embodiment, the intermediate layer can be preferably opened along a closed curve by means of a laser beam and the corresponding segment in the intermediate layer which is produced within the curve is preferably then raised mechanically or rinsed out.

As already mentioned, according to an embodiment, the isolating layer and/or intermediate layer can be applied over electrical components, electronic components or contact elements so that they are covered by the respective layer. In order to make contact with the respective component or contact element it is then possible to open or remove the intermediate layer at the location of the component or contact element so that a contact-formation process can be performed through the resulting cutout.

According to an embodiment, the intermediate layer can be embodied either as an insulating layer, as a conductive layer or as an insulating layer with conductive regions. According to an embodiment, the insulating intermediate layer may have preferably at least one of the materials of polyimide, polyethylene, polyphenol, polyether ether ketone or epoxide. According to an embodiment, the conductive regions in the intermediate layer can be soldered, welded or electrically conductively bonded to conductive regions of the substrate and/or of the respective component or of the respective contact element.

According to an embodiment, the intermediate layer can be provided by applying it and subsequent tempering (lamination), which can also be carried out in a vacuum under increased pressure.

According to an embodiment, relatively thick layers or conductive regions which are insulated on both sides can be produced by means of a laminated composite, that is to say by laminating a plurality of intermediate layers one over the other. Furthermore, according to an embodiment, the intermediate layer can be a photo-sensitive design so that the patterns for the cutouts can be produced photolithographically. According to an embodiment, the intermediate layer can generally be a film and in particular a photo-sensitive film. Finally, after the opening and removal of the intermediate layer and the removal of the isolating layer it is also possible, according to an embodiment, to provide a cleaning step in order, for example, to facilitate the subsequent formation of contact.

Figure 1:
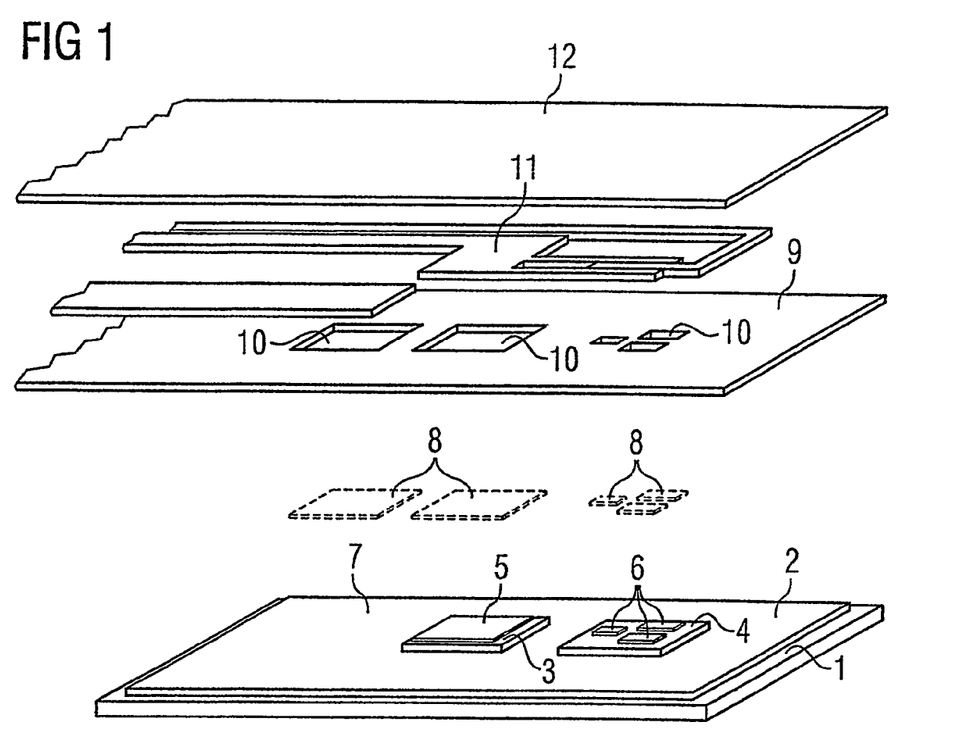
FIG. 1 shows a general design of a power semiconductor module manufactured according to an inventive method.

FIG. 1 shows a power semiconductor module which is manufactured according to an embodiment, in a spatial, exploded view of the layered structure. A substrate 1 which is coated at least on one side with a planar metallization has two semiconductor components 3 and 4 on the upper metallization surface 2. Said semiconductor components 3 and 4 are, for example, soldered on in a specific position or attached with precise positioning using some other suitable method.

The semiconductor component 3 (for example a diode) comprises an electrical contact 5, while the semiconductor component 4 (for example an IGBT or power transistor) has three contact-forming surfaces 6. Furthermore, contact will also be made with the metallization surface 2 at a location 7. At the contact locations 5, 6, 7 which are provided, in each case an isolating layer 8, 9, 10 is temporarily applied to the copper surface 2 and thus directly onto the substrate 1, for example laminated onto it, during the manufacturing process, but said isolating layer 8, 9, 10 is no longer present on the finished product and is therefore only indicated by dot-dashed lines in the drawings. However, in the edge regions of the substrate 1 or when the metallization surface 2 is patterned, the lamination can also take place directly onto the substrate 1. At the locations at which the contacts 5, 6 and 7 are provided, corresponding openings 10 are made in the intermediate layer 9 which is used for lamination and provided for insulation and is formed by a film. Conductor tracks 11 which correspond to the openings 10 and thus to the contacts 5, 6, 7 and which are applied, for example, to a film 12 form a flexible printed circuit board together with said film 12. The film 12 can be composed here of the same material as the film 9, with the film 9 forming an insulating intermediate layer, and the film 12 forming a partially conductive intermediate layer owing to the conductor tracks which are embodied, for example, as patterned metallizations. Polyimide, polyethylene, polyphenol, polyether ether ketone and/or epoxide are possible in themselves or in combination with one another as the insulating material for the films 9 and 2.

In the exemplary embodiment, AlN is provided as the material for the substrate 1, but any other insulating material can also be used depending on the respective application purpose. Preferably copper metallizations or aluminum metallizations are considered as metallizations.

FIG. 2 illustrates the method sequence by means of intermediate products which are illustrated in cross section. Here, an arrangement similar to that in FIG. 1 is assumed, in which case, for the purpose of better illustration, the semiconductor component 4 from FIG. 1 will have just one large contact surface corresponding to that of the semiconductor component 3 in the illustration according to FIG. 2.

Figure 2A:
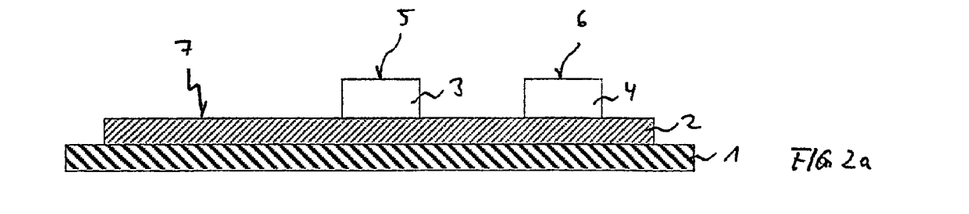
FIG. 2 shows a first embodiment of an inventive method.

FIG. 2a shows a substrate 1 with a metallization 2 onto which the semiconductor components 3 and 4 are soldered. The semiconductor components 3 and 4 each have a contact location 5 or 6 provided. Correspondingly, the metallization 2 has a contact location 7 provided.

Figure 2B:
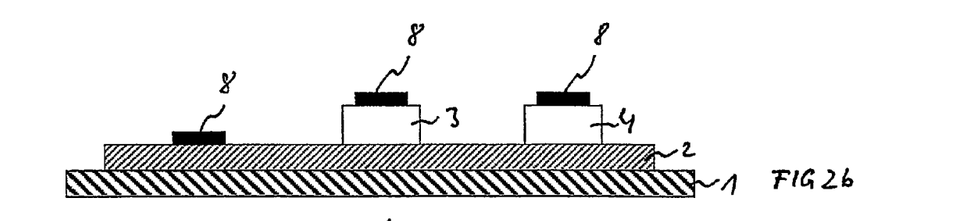
Figure 2C:
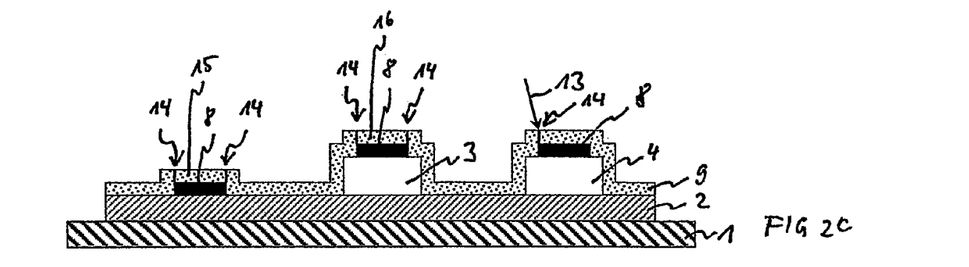
Figures 2D, 2E:
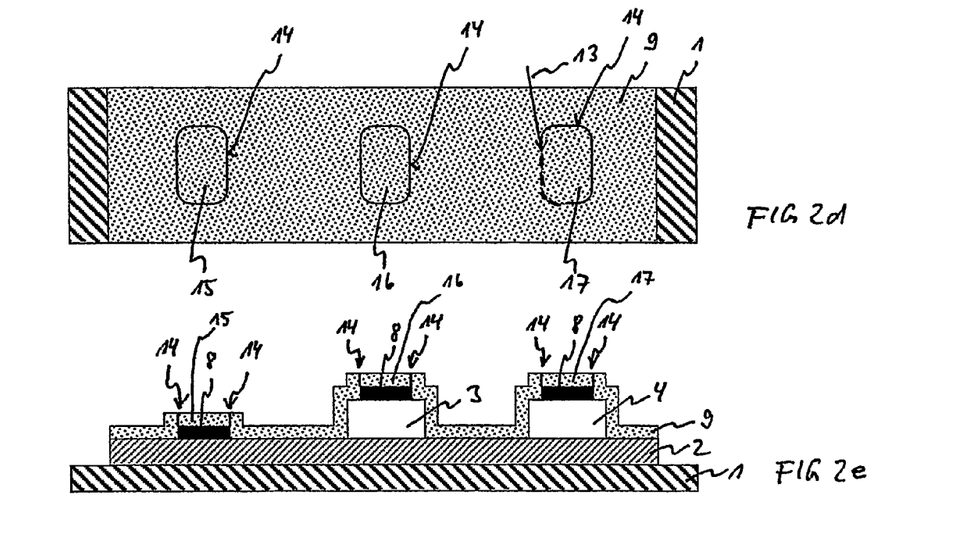
Figure 2F:
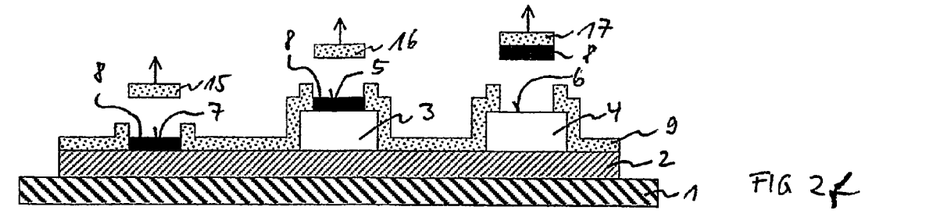
Figure 2G:
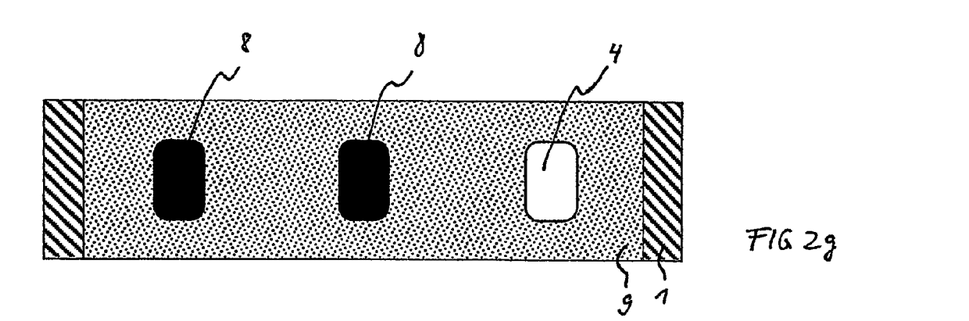
Figure 2H:
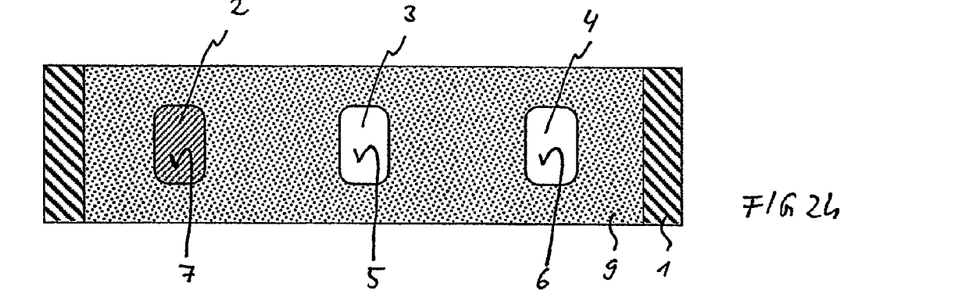
Figure 2I:
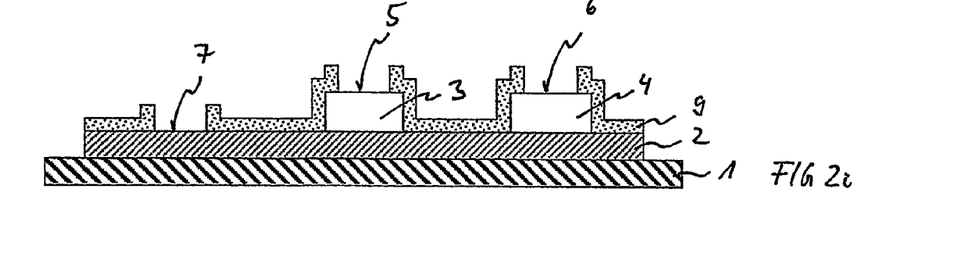

The insulating layer will be applied to the provided contact locations 5, 6, 7 in accordance with the insulating layer 9 from FIG. 1, in such a way that the desired contact locations 5, 6, 7 are exposed, as shown as a result in FIG. 2h in plan view and in FIG. 2i in cross section.

As illustrated in FIG. 2b, at first an isolating layer 8 which is preferably easier to apply compared to the intermediate layer 9 and preferably easier to remove again from the contact locations 5, 6, 7 will be applied to the contact locations 5, 6, 7 provided. Since the exemplary embodiment according to FIG. 2 involves patterned application of the isolating layer 8, in which the application is provided only at the locations to be covered, in particular resists, and especially organic-based resists, are recommended.

These can easily be applied by spraying, under certain circumstances by using appropriate mechanical masks, or can be appropriately sprayed on similarly to an inkjet printer by means of selective dispensing or structured dispensing. However, in the same way it is also possible to apply customary screen printing methods. As is apparent from FIG. 2, the sections of the isolating layer 8 which are located on the semiconductor components 3, 4 preferably do not extend as far as the lateral edge of the semiconductor components 3, 4.

The intermediate layer 9 which is embodied as a film is preferably laminated on under pressure over the entire arrangement on the side of the metallization 2 over the semiconductor components 3, 4 as well as over the isolating layer 8 by tempering so that the surface of the intermediate layer 9 shows the vertical profile of the layers and elements lying underneath it, as is illustrated in FIG. 2c. Since the sections of the isolating layer 8 which are located on the semiconductor elements 3, 4 do not extend as far as the edge of the semiconductor elements 3, 4, steps are produced between them and the sections of the isolating layer 8 and the intermediate layer 9 extends over said steps so that the intermediate layer 9 extends across the steps, which brings about good adhesion of the intermediate layer 9 in these regions.

Then, the intermediate layer 9 is opened at the locations corresponding to the contact locations 5, 6, 7. This can be done, for example, by means of laser ablation in which the sections of the intermediate layer 9 located above the contact locations 5, 6, 7 are removed by means of a laser beam. The introduction of laser light into the aforesaid sections of the intermediate layer 9 causes them to be burnt there.

The laser energy can advantageously be selected here so that it is somewhat stronger than is necessary to erode the intermediate layer 9 since the isolating layer 8 acts as a buffer here and is partially also eroded with it.

At any rate, the intermediate layer 9 can be removed 100% in this way without, however, damaging, for example, the semiconductor elements 3, 4 or the metallization 2. Instead of using a laser beam, it is of course also possible to use mechanical methods such as, for example, removal by grinding, milling, drilling, in which case the statements made with respect to the processing accuracy of the laser also apply here correspondingly.

However, it is most advantageous to open the desired region by means of a laser beam 13 at the circumference of the desired region. As is also apparent from FIG. 2c, for this purpose the laser beam 13 is used to produce a sectional line 14 in the intermediate layer 9, at which sectional line 14 the intermediate layer 9 is cut. The sectional line 14 is preferably embodied as a closed curve and can extend into the isolating layer 8 without, however, completely cutting it so that the semiconductor components 3, 4 and the metallization 2 are not damaged.

The sectional lines 14, can, as illustrated, be produced successively by using a single laser beam 13 or, as is not illustrated, by using a plurality of laser jets 13 simultaneously.

FIG. 2d shows a plan view of the arrangement according to FIG. 2c. It is apparent here that segments 15 and 16 have already been separated from the intermediate layer 9 by means of the laser beam 13. The sectional lines 14 which extend around the segments 15 and 16 are each embodied as a closed curve.

A further segment 17 which is to be cut from the intermediate layer 9 has already been partially separated from the laser beam 13, i.e. the sectional line 14 does not constitute a closed curve. In order to complete a closed curve, the laser beam 13 must still cut through the intermediate layer 9 along the dashed line.

After all the segments 15, 16, 17 to be removed have been completely separated from the remaining areas of the intermediate layer 9, an arrangement according to FIG. 2e is present.

In order to expose the contact locations 5, 6, 7, the separated segments 15, 16 and 17 of the intermediate layer 9 as well as the sections of the isolating layer 8 located under these segments have to be removed, which is indicated symbolically by arrows.

The isolating layer can be removed, for example, by introducing solvent and then, for example, levering out or rinsing out the segments 15, 16, 17 which have been defined with the laser beam during the opening process.

During the removal of the segments 15, 16, 17 from the intermediate layer 9 (illustrated in FIG. 2f) it is possible, as in the case of the segment 17, for the section of the isolating layer 8 which is respectively located under a segment 17 to continue to adhere to the respective segment 17 and to become detached from the respective contact location 6 together with said segment 17.

Likewise, it is possible, during the removal of the segments 15 and 16, that the segments 15, 16 will become entirely or partially detached from the sections of the isolating layer 8 lying under them so that the respective sections of the isolating layer 8 remain at the respective contact locations 7, 5.

The isolating layer 8 or the parts which have remained of it can, if it has not yet happened, then be removed in a way which is less damaging compared to the previous working step so that the contact locations 5, 6, 7 are not adversely affected in any way. The remaining parts of the isolating layer 8 can be removed, for example, by means of solvents, etching agents and, in the case of a light-sensitive isolating layer, by developing.

After the complete removal of the segments 15, 16, 17 and of the sections of the isolating layer 8 located under them, the contact locations 5, 6, 7 are freely accessible, as is illustrated in FIG. 2h in plan view and in FIG. 2i in a vertical section.

The removal of the segments 15, 16, 17 of the sections of the isolating layer 8 lying under them can, where necessary, also be followed by a specific cleaning step for the contact locations 5, 6, 7 (for example chemical polishing). The arrangement is then available for further method steps.

Figure 3A:
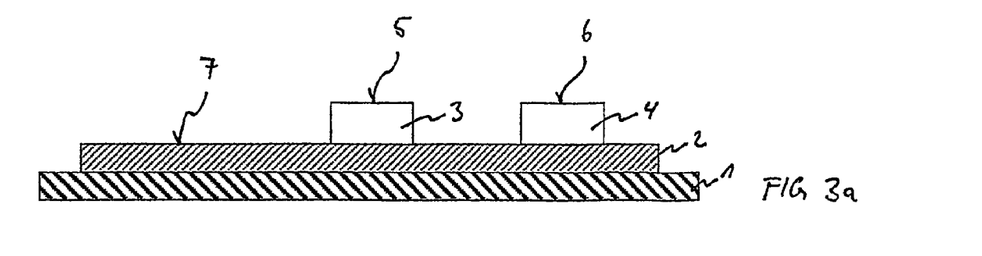
FIG. 3 shows a second embodiment of an inventive method.
Figure 3B:
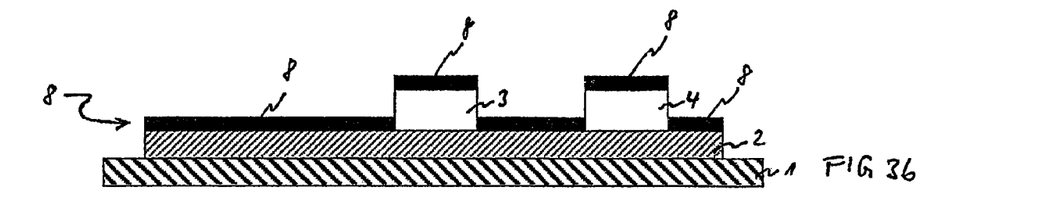
Figure 3C:
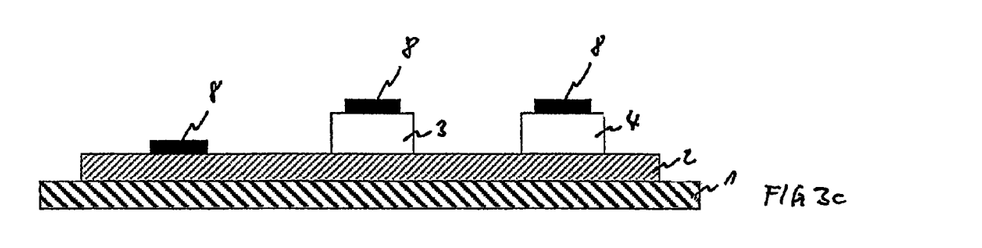

A further exemplary embodiment in which the arrangement according to FIG. 2b is illustrated in a different way is shown in FIG. 3. Starting from the arrangement according to FIG. 3a, which corresponds to the arrangement according to FIG. 2a, the substrate 1 including the metallization 2 and the semiconductor components 3, 4 is arranged at least one the side on which the contact surfaces 5, 6, 7 are arranged, covered by the isolating layer 8 over a large area, which is illustrated in FIG. 3*b*.

The isolating layer 8 is preferably composed of photoresist here. This is followed by exposure according to a pattern corresponding to the contact surfaces 5, 6, 7 provided, while taking into account the specific photochemical properties of the photoresist used, specifically in particular as a function of whether the photoresist is a positive or negative photoresist. This is followed by development and removal of the isolating layer 8 at the undesired (exposed or unexposed) locations. As a result of this, an intermediate project is obtained which is identical to the intermediate product according to FIG. 2*b*. All the further steps correspond to the steps which have already been explained with reference to FIGS. 2*c* to 2*i*.

A further advantage of the method according to an embodiment apart from simple handling is in particular also the possibility of eroding large areas completely. For example, with the conventional method by means of laser ablation over an area, long processing times occur. However, using an isolating layer makes it also possible to isolate components with identical abstraction capabilities since the isolation can also be carried out in a purely mechanical way. Thus, the intermediate layer to be removed can, for example, be opened at just one location and then lifted off so that the opening and removal can take place in a single step.

The isolating layer according to an embodiment is therefore preferably either pressed onto the surface or applied to the surface by spraying by means of selective dispensing or structured dispensing. The medium used for the isolating layer here is preferably one which can be metered precisely and which can be applied without further wetting of the underlying surface, that is to say the isolating agent does not become widely dispersed. Preferred isolating agents are silicone and other organic layers. After the isolating layer has been applied, according to an embodiment the intermediate layer, which is preferably formed by a film, is laminated. The film is laminated onto the underlying surface at a specific temperature and under pressure. It is advantageous here if the film is not connected to the underlying surface in the region of the isolating agent and there is thus no connection between the film and the underlying surface in this region.

Then, the desired regions of the intermediate layer are opened. To do this, a laser is traced around the region to be opened. It is important here that the laser traces around the isolating surface exactly, thus permitting the film to be removed without film residues remaining on the underlying surface. Laser cutting also enables an activation fluid or an etching solution to penetrate the isolating layer so that the isolating layer is removed when the intermediate layer is still present. If appropriate, remaining parts of the film which protrude upwards at the edge can then be removed in a further laser step. When silicone is used as the isolating layer, it can be dissolved by means of chemical solvents and thus be removed from the underlying surface. The opened regions can then easily be removed by movement in the solvent or by mechanically pulling them off. In order to clean the now exposed regions of residues of the isolating agent, this can be followed by cleaning of the surfaces in, for example, a wet-chemical fashion or by means of plasma cleaning in order to prevent residues remaining. Moreover, the isolating agent can also be embodied in such a way that the lamination film does not adhere to the isolating layer so that without the use of etching agents and developing agents the intermediate layer cannot be readily removed after the circumference has been cut with the laser.

Another embodiment specifically uses the combination with semiconductor components, in particular power semiconductor components. In order to expose the contact surfaces, photoresist is eroded from a metallic surface here. If this photoresist is left on the surface and the film already laminated onto the exposed photoresist, the exposed photoresist forms the isolating layer. The film is then laminated in the usual way. During the opening process, all that is then important is to access all the contact surfaces and to trace around the surface to be opened. The exposed isolating layer can then be eroded by means of a developer material. The film is eroded in the same process step by rinsing out the separated and thus exposed film segment. Subsequent cleaning can, as already mentioned, be carried out by means of plasma etching. The particular feature of this embodiment is the combination of a typical semiconductor process with film technology and the utilization of the possibility of using the exposed surfaces also as an isolating layer for windows with film technology.

In addition to the particularly advantageous embodiments illustrated above, it is also possible to carry out erosion over a large area as in the conventional way, for example by means of laser ablation or mechanically, in which case the isolating layer also provides advantages compared to the conventional method since the isolating layer provides a certain degree of protection for the surfaces lying under it.

LIST OF REFERENCE NUMERALS

| | |
|---|---|
| 1 | Substrate |
| 2 | Metallization |
| 3, 4 | Semiconductor components |
| 5, 6, 7 | Contact locations provided |
| 8 | Isolating layer |
| 9 | Intermediate layer |
| 10 | Isolating layer |
| 11 | Conductor track |
| 12 | Film |
| 13 | Laser beam |
| 14 | Sectional line |
| 15 | Segment of the intermediate layer |
| 16 | Segment of the intermediate layer |
| 17 | Segment of the intermediate layer |

The invention claimed is:

1. A method for the structured application of a laminatable intermediate layer to a substrate for a semiconductor module, the method comprising the steps of:

applying an isolating layer indirectly or directly to the substrate over a large area so that at least one semiconductor component or contact element attached to the substrate is covered by the isolating layer, applying the intermediate layer by lamination over a large area to the substrate including the isolating layer so that the at least one semiconductor component or contact element is further covered by the intermediate layer, opening the intermediate layer after being applied to the substrate at locations on the substrate to provide cutouts in the intermediate layer to expose the isolating layer at the cutout locations, the cutouts in the intermediate layer being produced by means of a laser such that in the region of each cutout a segment of the intermediate layer is completely separated from the remainder of the intermediate layer and then removed; and removing the isolating layer at the cutout locations after the isolating layer is applied to the substrate to expose at least partially a surface of the at least one semiconductor component or contact element.

2. The method as claimed in claim 1, wherein the isolating layer is applied by means of selective dispensing or by means of structured dispensing.

3. The method as claimed in claim 1, wherein the isolating layer is applied by means of a printing method.

4. The method as claimed in claim 1, wherein the isolating layer is applied by means of a lithography method.

5. The method as claimed in claim 1, wherein the isolating layers has silicone.

6. The method as claimed in claim 1, wherein the isolating layer has organic compounds.

7. The method as claimed in claim 1, wherein the isolating layer is photo-sensitive.

8. The method as claimed in claim 7, wherein, in order to apply the photo-sensitive isolating layer in a structured fashion, it is applied to the substrate over a large area and then exposed in accordance with the pattern of the cutouts provided, and then removed.

9. The method as claimed in claim 7, wherein, in order to remove the photo-sensitive isolating layer, the photo-sensitive isolating layer is firstly activated and then etched.

10. The method as claimed in claim 1, wherein the opening of the intermediate layer is carried out by means of laser ablation at the locations provided for that purpose.

11. The method as claimed in claim 1, wherein, after the opening of the intermediate layer at locations on the substrate to provide cutouts, the cutouts are removed by means of mechanical abrasion at the locations provided for that purpose.

12. The method as claimed in claim 1, wherein the intermediate layer is an insulating intermediate layer.

13. The method as claimed in claim 12, wherein the insulating intermediate layer has polyimide, polyethylene, polyphenol, polyether ether ketone and/or epoxide.

14. The method as claimed in claim 1, wherein the intermediate layer is electrically conductive or has electrically conductive regions.

15. The method as claimed in claim 14, wherein the conductive regions are soldered or electrically conductively bonded or welded to conductive regions of the substrate and/or of the component.

16. The method as claimed in claim 1, wherein in which in order to provide the intermediate layer, the intermediate layer is firstly applied and then tempered.

17. The method as claimed in claim 1, wherein the laminating is carried out under pressure.

18. The method as claimed in claim 1, wherein the intermediate layer is photo-sensitive and the cutout or cutouts are produced photolithographically.

19. The method as claimed in claim 1, wherein a plurality of insulating and/or conducting intermediate layers are arranged one on top of the other to form a composite and are laminated to one another.

20. The method as claimed in claim 1, wherein a post-cleaning step is carried out after the intermediate layer has been opened and removed at the cutout locations.

21. The method as claimed in claim 1, wherein the intermediate layer is a film.

22. A method for the structured application of a laminatable intermediate layer to a substrate for a semiconductor module, the method comprising the steps of:

coating the substrate on at least one side with a planar metallization;

adhering at least one semiconductor component or contact element to the substrate side having the planar metallization;

applying an isolating layer indirectly or directly to the substrate so that the at least one semiconductor component or contact element attached to the substrate is covered by the isolating layer, applying the intermediate layer by lamination over to the substrate including the isolating layer so that the at least one semiconductor component or contact element is further covered by the intermediate layer, opening the intermediate layer at locations on the substrate to provide cutouts in the intermediate layer to expose the isolating layer at the cutout locations, the cutouts in the intermediate layer being produced by means of a laser such that in the region of each cutout a segment of the intermediate layer is completely separated from the remainder of the intermediate layer and then removed; and removing the isolating layer at the cutout locations after the isolating layer is applied to the substrate to expose at least partially a surface of the at least one semiconductor component or contact element.

* * * * *